US010804261B2

(12) United States Patent
Han et al.

(10) Patent No.: US 10,804,261 B2
(45) Date of Patent: *Oct. 13, 2020

(54) INDIRECT READOUT FET

(71) Applicant: INTERNATIONAL BUSINESS MACHINES CORPORATION, Armonk, NY (US)

(72) Inventors: Jin-Ping Han, Yorktown Heights, NY (US); Yulong Li, Hartsdale, NY (US); Dennis M. Newns, Yorktown Heights, NY (US); Paul M. Solomon, Yorktown Heights, NY (US); Xiao Sun, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/662,284

(22) Filed: Oct. 24, 2019

(65) Prior Publication Data

US 2020/0058641 A1 Feb. 20, 2020

Related U.S. Application Data

(60) Continuation of application No. 16/360,690, filed on Mar. 21, 2019, now Pat. No. 10,559,562, which is a
(Continued)

(51) Int. Cl.
*H01L 27/06* (2006.01)
*H01L 27/11507* (2017.01)
(Continued)

(52) U.S. Cl.
CPC ...... *H01L 27/0629* (2013.01); *H01L 27/1159* (2013.01); *H01L 27/11507* (2013.01);
(Continued)

(58) Field of Classification Search
None
See application file for complete search history.

(56) References Cited

U.S. PATENT DOCUMENTS 5,960,265 A 9/1999 Acovic et al.
6,194,748 B1 2/2001 Yu
(Continued)

OTHER PUBLICATIONS

Gokmen et al., "Acceleration of Deep Neural Network Training with Resistive Cross-Point Devices: Design Considerations," Frontiers in Neuroscience. vol. 10, Article 333. Jul. 21, 2016. pp. 1-13.
(Continued)

*Primary Examiner* — Alexander G Ghyka
(74) *Attorney, Agent, or Firm* — Tutunjian & Bitetto, P.C.; Vazken Alexanian (57) ABSTRACT

A metal-insulator-metal (MIM) capacitor structure includes source and drain regions formed within a semiconductor substrate, a first conducting layer formed over the source and drain regions, and a dielectric layer formed over the first conducting layer. The MIM capacitor structure further includes a second conducting layer formed over the dielectric layer, and a sidewall dielectric formed adjacent the first conducting layer and the dielectric layer. An electric field is created indirectly through the sidewall dielectric to an adjacent field effect transistor (FET) channel in the semiconductor substrate.

20 Claims, 6 Drawing Sheets

Related U.S. Application Data division of application No. 15/585,876, filed on May 3, 2017, now Pat. No. 10,332,874.

(51) Int. Cl.

| | |
|---|---|
| *H01L 27/1159* | (2017.01) |
| *H01L 29/06* | (2006.01) |
| *H01L 29/49* | (2006.01) |
| *H01L 29/51* | (2006.01) |
| *H01L 21/28* | (2006.01) |

(52) U.S. Cl.
CPC .... *H01L 29/0649* (2013.01); *H01L 29/40111* (2019.08); *H01L 29/4966* (2013.01); *H01L 29/516* (2013.01)

(56) References Cited

U.S. PATENT DOCUMENTS

| | | | |
|---|---|---|---|
| 6,229,161 | B1 | 5/2001 | Nemati et al. |
| 6,399,979 | B1 | 6/2002 | Noble et al. |
| 6,627,930 | B1 | 9/2003 | Fox et al. |
| 7,408,213 | B2 | 8/2008 | Abe |
| 7,812,411 | B2 | 10/2010 | Cheng |
| 10,332,874 | B2 * | 6/2019 | Han ................... H01L 27/0629 |
| 2004/0195603 | A1 * | 10/2004 | Ito ..................... H01L 27/11502 257/295 |
| 2004/0217401 | A1 * | 11/2004 | Sakai ................ H01L 29/40111 257/295 |
| 2012/0292677 | A1 * | 11/2012 | Dubourdieu ...... H01L 29/42316 257/295 |
| 2013/0149796 | A1 * | 6/2013 | Wang ................ H01L 27/11507 438/3 |
| 2016/0284862 | A1 * | 9/2016 | Yamazaki ......... H01L 29/78606 |
| 2019/0221559 | A1 * | 7/2019 | Han ..................... H01L 27/0629 |
| 2019/0393298 | A1 * | 12/2019 | Lin ..................... H01L 23/5223 |
| 2020/0013785 | A1 * | 1/2020 | Frank ................. H01L 27/1159 |

OTHER PUBLICATIONS

Gokmen et al., "Circuit Methodology for Highly Linear and Symmetric Resistive Processing Unit," U.S. Appl. No. 15/335,171, filed Oct. 26, 2016. pp. 1-34.

Ma et al., "Why is Nonvolatile Ferroelectric Memory Field-Effect Transistor Still Elusive?" IEEE Electron Device Letters, vol. 23, No. 7. Jul. 2002. pp. 386-388.

Nawrocki et al., "A Mini Review of Neuromorphic Architectures and Implementations," IEEE Transactions on Electron Devices, vol. 63, No. 10. Aug. 24, 2016. pp. 3819-3829.

List of IBM Patents or Patent Applications Treated as Related dated Oct. 24, 2019, 2 pages.

* cited by examiner

INDIRECT READOUT FET

BACKGROUND

Technical Field

The present invention relates generally to semiconductor devices, and more specifically, to coupling a capacitor's polarization to a semiconductor channel via a dielectric sidewall.

Description of the Related Art

Ferroelectric materials are composed of many randomly-distributed permanently polarized regions. When an electric field is applied, the regions with a polarization component in the direction of the electric field grow at the expense of the non-aligned regions so that a net polarization can result. If the electric field decreases, the polarization also decreases but at a slower rate so that even when the electric field becomes zero, a remnant polarization remains. A negative coercive field is needed to bring the polarization to zero. This hysteresis behavior of a ferroelectric material is the basis of ferroelectric nonvolatile memory devices.

Currently there are two types of ferroelectric nonvolatile memory devices: ferroelectric capacitor which uses a transistor to detect the polarization of a ferroelectric capacitor, and ferroelectric transistor which detects a change in the transistor conductance caused by the polarization of a ferroelectric gate material.

SUMMARY

In accordance with an embodiment, a metal-insulator-metal (MIM) capacitor structure is provided. The metal-insulator-metal (MIM) capacitor structure includes source and drain regions formed within a semiconductor substrate, a slot defined in a bottom metal electrode, a first conducting layer formed over the source and drain regions, a ferroelectric layer formed over the first conducting layer, and a second conducting layer (bottom metal electrode) formed over the ferroelectric layer. The slot allows modulation of a field effect transistor (FET) channel formed in the semiconductor substrate.

In accordance with an embodiment, a metal-insulator-metal (MIM) capacitor structure is provided. The metal-insulator-metal (MIM) capacitor structure includes source and drain regions formed within a semiconductor substrate, a first conducting layer formed over the source and drain regions, a ferroelectric layer formed over the first conducting layer, a second conducting layer formed over the ferroelectric layer, and a sidewall dielectric formed adjacent the first conducting layer and the ferroelectric layer. An electric field is created indirectly through the sidewall dielectric to an adjacent field effect transistor (FET) channel in the semiconductor substrate.

In accordance with an embodiment, a metal-insulator-metal (MIM) capacitor structure is provided. The metal-insulator-metal (MIM) capacitor structure includes source and drain regions formed within a semiconductor substrate, a slot defined in a bottom metal electrode, a first conducting layer formed over the source and drain regions, a doped region defined between the source and drain regions, the doped region being aligned with the slot defined in the bottom metal electrode, a ferroelectric layer formed over the first conducting layer, and a second conducting layer (bottom metal electrode) formed over the ferroelectric layer. The slot allows modulation of a field effect transistor (FET) channel formed in the semiconductor substrate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for a transistor, such as a ferroelectric-gate-controlled semiconductor field-effect transistor (FET), which employs a ferroelectric film in the gate stack of the FET, and in which a proper polarization of the ferroelectric film can create an inversion layer in a channel region of the transistor. The basic ferroelectric-gate controlled field-effect transistor is a metal-ferroelectric-metal (MFM) FET. The term MFM represents the layers in the gate stack of the ferroelectric transistor. Thus, the gate stack of the MFM transistor includes a metal (M) gate electrode disposed on a ferroelectric (FE) gate dielectric on metal (M) layer formed over a semiconductor channel of the transistor.

Embodiments in accordance with the present invention provide methods and devices for coupling a capacitor's polarization to a semiconductor channel via a dielectric sidewall. Metal-ferroelectric-metal (MFM) structures are provided with a metallic field shield or a sneak path to a semiconductor including source and drain regions. The field shield suppresses direct modulation of the semiconductor, while including a structure for diverting a portion of the electric field to the semiconductor region having the source and drain regions.

Embodiments in accordance with the present invention provide methods and devices for a rectangular ferroelectric (FE) capacitor, pinned at each end with opposite polarization, resulting in two regions of opposite polarization over the entire rectangle with a single domain wall or boundary between the two ends. Application of a voltage to the capacitor causes the domain wall or boundary to move, depending on the sign of the voltage, the relative area of the two regions determining the state of the device. The pinning region can be either transverse to the readout FET, dividing the channel longitudinally into two regions of varying lengths having different resistivities, or along the channel, dividing the channel width into two regions.

It is to be understood that the present invention will be described in terms of a given illustrative architecture; however, other architectures, structures, substrate materials and process features and steps and/or blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
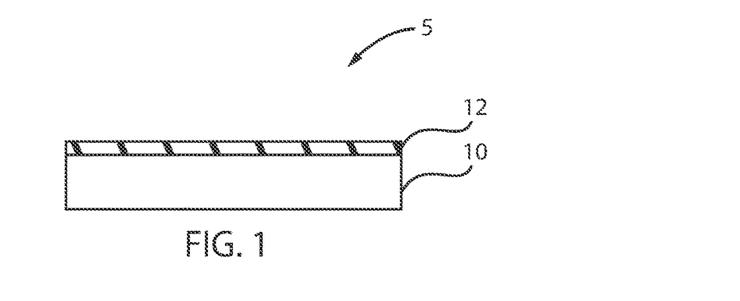
FIG. 1 is a cross-sectional view of a dielectric layer formed over a semiconductor substrate, in accordance with the present invention.

FIG. 1 is a cross-sectional view of a dielectric layer formed over a semiconductor substrate, in accordance with the present invention.

A structure 5 includes a dielectric layer 12 formed over a semiconductor structure 10. In one example, the dielectric layer 12 can have a thickness of about 10 nm.

The dielectric 12 is a non-conducting material or substance. (A dielectric is an electrical insulator.) Some dielectrics commonly used in semiconductor technology are $SiO_2$ ("oxide") and $Si_3N_4$ ("nitride").

Figure 2:
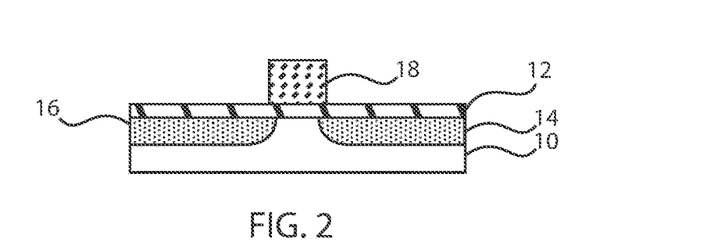
FIG. 2 is a cross-sectional view of FIG. 1 where source and drain regions are formed in the semiconductor substrate and a polysilicon mandrel is deposited over a portion of the dielectric layer, in accordance with the present invention.

FIG. 2 is a cross-sectional view of FIG. 1 where source and drain regions are formed in the semiconductor substrate and a polysilicon mandrel is deposited over a portion of the dielectric layer, in accordance with the present invention.

In various embodiments, source and drain regions 14, 16 are formed within the semiconductor substrate 10. Additionally, a mandrel or mandrel mask 18 is deposited over a portion of the dielectric layer 12. The mandrel mask 18 can be, e.g., centrally disposed on the dielectric layer 12. In one example, the mandrel 18 can have a thickness of about 30 nm and a width of about 50 nm. In one example, the structure can be annealed at about 950° C. for about 5 seconds.

In various embodiments, the doped source and drain 14, 16 is advantageously deposited or formed via epitaxial growth. Depending on how the epitaxial growth develops, it can be necessary to anisotropically etch the epitaxial growth, in order to result in a top surface of the source and drain region 14, 16 that is suitable for subsequent processing.

The dopant can be provided to the doped region(s) 14, 16 (e.g., source and drain region(s)) by ion implantation, and source and drains formed by annealing the doped region(s) 14, 16. In various embodiments, the doped region 14, 16 can be n-doped or p-doped.

Figures 3, 4:
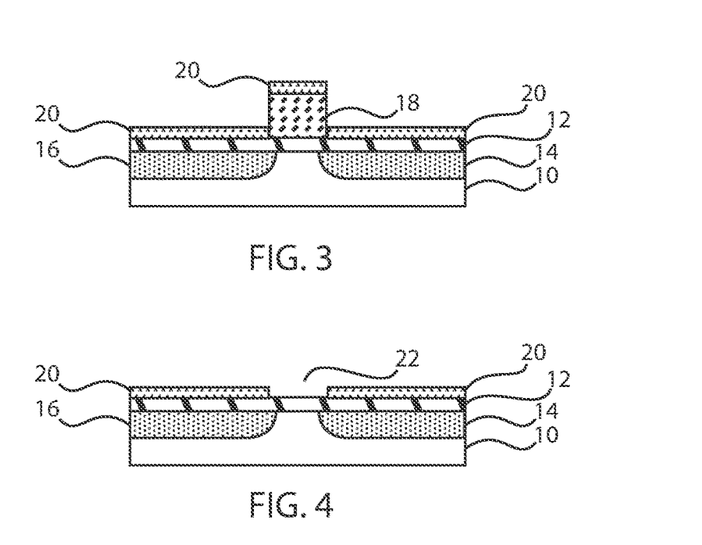
FIG. 3 is a cross-sectional view of FIG. 2 where a first conducting layer is deposited over the dielectric layer and the mandrel, in accordance with the present invention.
FIG. 4 is a cross-sectional view of FIG. 3 where the mandrel is removed, in accordance with the present invention.

FIG. 3 is a cross-sectional view of FIG. 2 where a first conducting layer is deposited over the dielectric layer and the mandrel, in accordance with the present invention.

In various embodiments, a first conducting layer 20 is deposited over the dielectric layer 12 and over the mandrel 18. The first conducting layer 20 can be a metal layer. The metal layer 20 can be, e.g., a titanium nitride (TiN) layer. In one example, the metal layer 20 can have a thickness of about 10 nm.

FIG. 4 is a cross-sectional view of FIG. 3 where the mandrel is removed, in accordance with the present invention.

In various embodiments, the mandrel 18 is removed to expose a top surface 22 of the dielectric layer 12. Thus, this results in the first conducting layer 20 being formed over the source and drain regions 14, 16. The mandrel 18 can be removed by, e.g., a wet etch process.

Wet etch is performed with a solvent (such as an acid) which can be chosen for its ability to selectively dissolve a given material (such as oxide), while leaving another material (such as polysilicon) relatively intact. This ability to selectively etch given materials is fundamental to many semiconductor fabrication processes. A wet etch will generally etch a homogeneous material (e.g., oxide) isotropically, but a wet etch can also etch single-crystal materials (e.g., silicon wafers) anisotropically.

Figure 5:
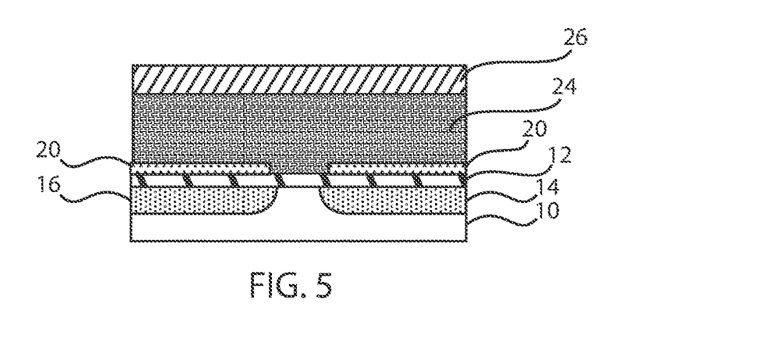
FIG. 5 is a cross-sectional view of FIG. 4 where a ferroelectric layer and a second conducting layer are formed over the first conducting layer, in accordance with the present invention.

FIG. 5 is a cross-sectional view of FIG. 4 where a ferroelectric layer and a second conducting layer are formed over the first conducting layer, in accordance with the present invention.

In various embodiments, a ferroelectric layer 24 is deposited, followed by the deposition of a second conducting layer 26. The ferroelectric layer 24 can be, e.g., a hafnium oxide layer. The second conducting layer 26 can be a metal layer. The metal layer 26 can be, e.g., a TiN layer. The thickness of the metal layer 26 can be, e.g., 20 nm.

The ferroelectric controllable layer 26 can be a layer such as a ferroelectric material or a normally non-ferroelectric material that exhibits ferroelectric properties upon application of an external stress thereto. Non-limiting examples of a ferroelectrically controllable layer include $BaTiO_3$, PZT, SBT, $SrTiO_3$ (STO), $Ba_{1-x}Sr_xTiO_3$ (BST), $PbTiO_3$, $CaMnO_3$ and $BiFeO_3$.

Figure 6:
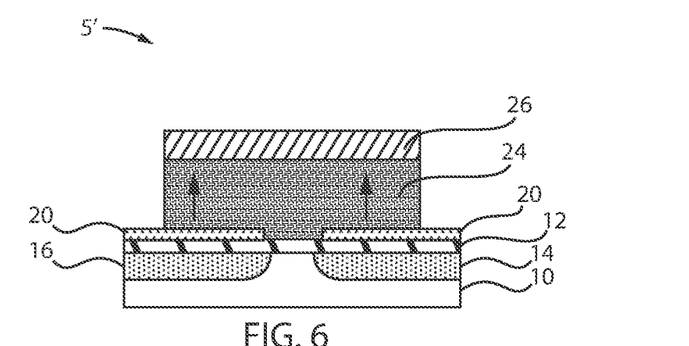
FIG. 6 is a cross-sectional view of FIG. 5 where the first conducting layer, the ferroelectric layer, and the second conducting layer are patterned and portions etched away, in accordance with the present invention.

FIG. 6 is a cross-sectional view of FIG. 5 where the first conducting layer, the ferroelectric layer, and the second conducting layer are patterned and portions etched away, in accordance with the present invention.

In various embodiments, the first conducting layer 20, the ferroelectric layer 24, and the second conducting layer 26 are patterned and portions etched away to form resulting structure 5'.

Figure 7:
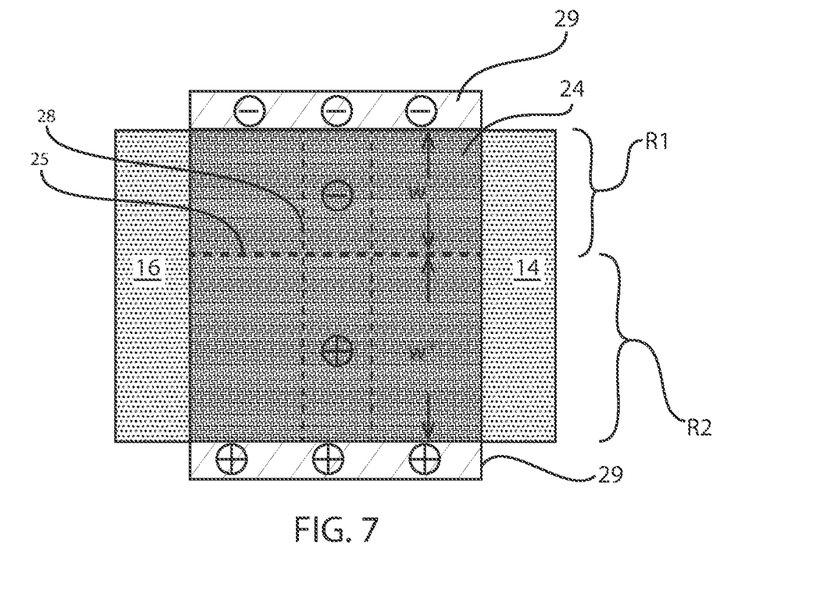
FIG. 7 is a plan view of FIG. 6, with the second conducting layer removed, where pinning layers are shown, as well as a slot defined in the bottom metal electrode for allowing modulation of a field effect transistor (FET) channel, in accordance with the present invention.

FIG. 7 is a plan view of FIG. 6, with the second conducting layer removed, where pinning layers are shown, as well as a slot defined in the bottom metal electrode for allowing modulation of a field effect transistor (FET) channel, in accordance with the present invention.

In various embodiments, the structure 5' of FIG. 6 is an MFM capacitor with pinning layers 29 and a slot 28 in the bottom electrode 20 allowing modulation of the FET channel underneath. The width of the slot 28 is small compared to the total FE width (distance between source and drain regions, 14, 16). The single domain wall or boundary 25, which can move reversibly in response to +/− gate voltages, demarcates the FET into regions (R1 and R2) of enhanced and reduced conductivity along the width direction. This implementation is inherently linear since the overall conductivity is proportional to the widths, $w^+$ and $w^-$, of the two regions (R1 and R2).

Figure 8:
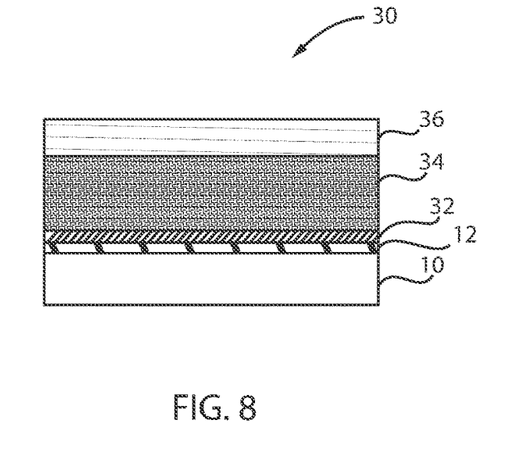
FIG. 8 is a cross-sectional view of a dielectric layer formed over a semiconductor substrate, as well as a metal-ferroelectric-metal (MFM) capacitor stack formed thereon, in accordance with another embodiment of the present invention.

FIG. 8 is a cross-sectional view of a dielectric layer formed over a semiconductor substrate, as well as a metal-ferroelectric-metal (MFM) capacitor stack formed thereon, in accordance with another embodiment of the present invention.

A structure 30 includes a dielectric layer 12 formed over a semiconductor structure 10. In one example, the dielectric layer 12 can have a thickness of about 10 nm. A first conducting layer 32, a ferroelectric layer 34, and a second conducting layer 36 are deposited over the dielectric layer 12. The first conducting layer 32 can be, e.g., a TiN layer. The TiN layer 32 can have a thickness of about 10 nm. The ferroelectric layer 34 can be, e.g., a hafnium oxide layer. The hafnium oxide layer 34 can have a thickness of about 10 nm. The second conducting layer 36 can be, e.g., a TiN layer. The TiN layer 36 can have a thickness of about 20 nm.

Figure 9:
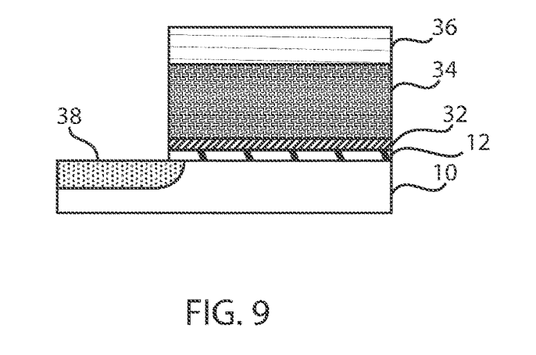
FIG. 9 is a cross-sectional view of FIG. 8 where the MFM capacitor stack is patterned and a portion etched away and a doped region is formed within the semiconductor substrate, in accordance with the present invention.

FIG. 9 is a cross-sectional view of FIG. 8 where the MFM capacitor stack is patterned and a portion etched away and a doped region is formed within the semiconductor substrate, in accordance with the present invention.

In various embodiments, the MFM capacitor stack (32, 34, 36) is patterned and a portion etched away and a doped region 38 is formed within the semiconductor substrate 10. In one example, the doped region 38 is doped with an n-type dopant.

However, a dopant element can be introduced into the semiconductor to establish either p-type (acceptors) or n-type (donors) conductivity. Common dopants in silicon are: for p-type—boron (B), Indium (In); for n-type—phosphorous (P) arsenic (As), antimony (Sb). Dopants are of two types—"donors" and "acceptors". N type implants are donors and P type are acceptors.

Figure 10:
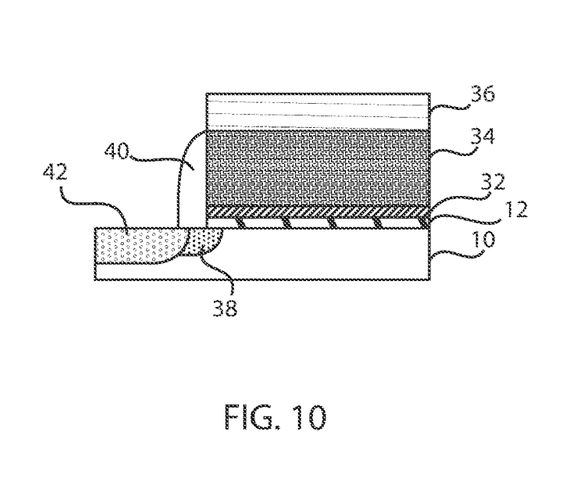
FIG. 10 is a cross-sectional view of FIG. 9 where a sidewall dielectric is formed adjacent the MFM capacitor stack, in accordance with the present invention.

FIG. 10 is a cross-sectional view of FIG. 9 where a sidewall dielectric is formed adjacent the MFM capacitor stack, in accordance with the present invention.

In various embodiments, a sidewall dielectric 40 is formed adjacent the MFM capacitor stack (32, 34, 36). The sidewall dielectric 40 can be, e.g., hafnium oxide. A channel stop 42 can also be formed adjacent the doped region 38. The final structure is designated as 30' (FIG. 11).

Figure 11:
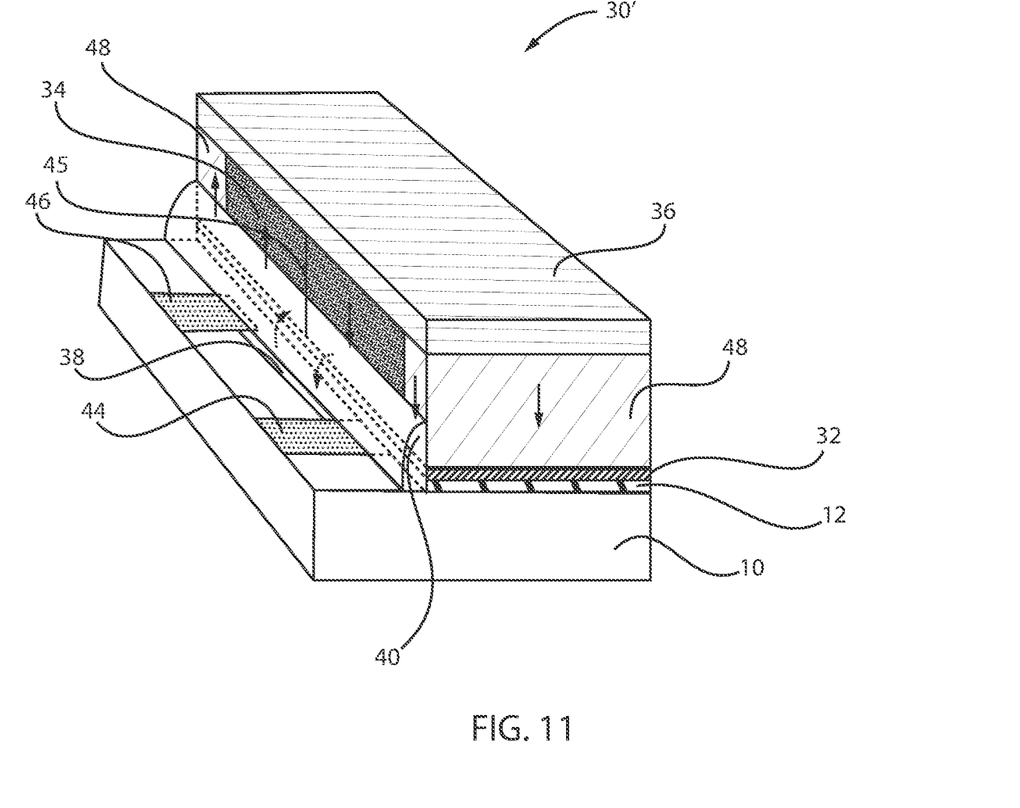
FIG. 11 is a perspective view of FIG. 10 illustrating the sidewall dielectric extending along a portion of the MFM capacitor stack, in accordance with the present invention.

FIG. 11 is a perspective view of FIG. 10 illustrating the sidewall dielectric extending along a portion of the MFM capacitor stack, in accordance with the present invention.

In various embodiments, the second structure 30' has an MFM capacitor including pinning layers 48 with a high permittivity spacer 40 (sidewall dielectric) permitting coupling of the MFM polarization through the spacer 40 to an n-type doped FET channel 38 running along the same edge. The single domain wall or boundary 45, which can move reversibly in response to +/− gate voltages, demarcates the FET into regions of enhanced and reduced conductivity along the length direction. An n-doped channel is needed for an n-type FET in order that the channel does not become completely depleted under opposing polarization condition. It is understood in all the embodiments that they apply to complimentary structures as well where p and n type doping is interchanged.

Additionally, the source and drain regions 44, 46 are shown formed within the semiconductor structure 10.

Figure 12:
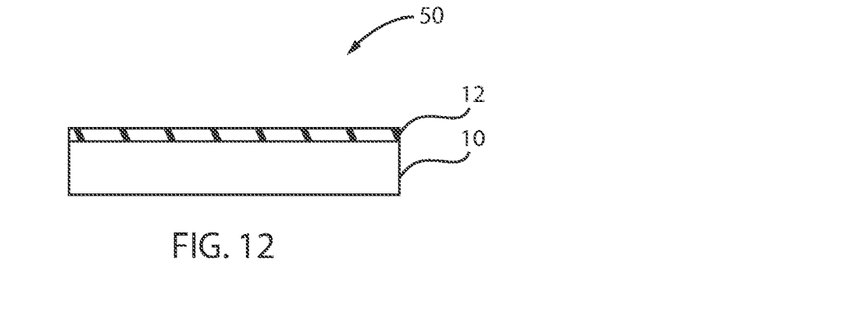
FIG. 12 is a cross-sectional view of a dielectric layer formed over a semiconductor substrate, in accordance with another embodiment of the present invention.

FIG. 12 is a cross-sectional view of a dielectric layer formed over a semiconductor substrate, in accordance with another embodiment of the present invention.

A structure 50 includes a dielectric layer 12 formed over a semiconductor structure 10. In one example, the dielectric layer 12 can have a thickness of about 10 nm.

Figure 13:
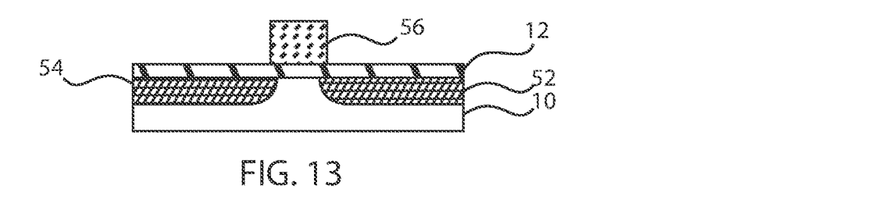
FIG. 13 is a cross-sectional view of FIG. 12 where source and drain regions are formed in the semiconductor substrate and a polysilicon mandrel is deposited over a portion of the dielectric layer, in accordance with the present invention.

FIG. 13 is a cross-sectional view of FIG. 12 where source and drain regions are formed in the semiconductor substrate and a polysilicon mandrel is deposited over a portion of the dielectric layer, in accordance with the present invention.

In various embodiments, source and drain regions 52, 54 are formed within the semiconductor substrate 10. Additionally, a mandrel or mandrel mask 56 is deposited over a portion of the dielectric layer 12. The mandrel mask 56 can be, e.g., centrally disposed on the dielectric layer 12. In one example, the mandrel 56 can have a thickness of about 30 nm and a width of about 50 nm. In one example, the structure can be annealed at about 950° C. for about 5 seconds.

Figure 14:
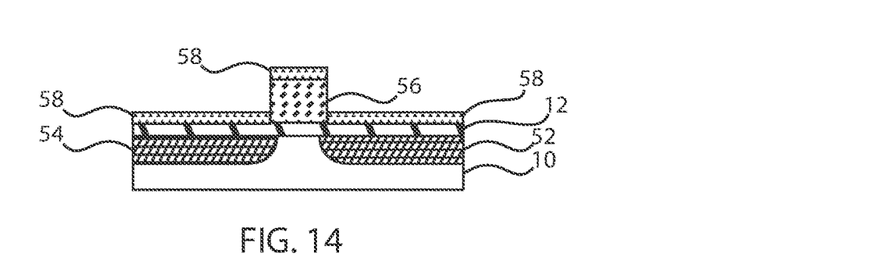
FIG. 14 is a cross-sectional view of FIG. 13 where a first conducting layer is deposited over the dielectric layer and the mandrel, and a doped region is formed between the source and drain regions, in accordance with the present invention.

FIG. 14 is a cross-sectional view of FIG. 13 where a first conducting layer is deposited over the dielectric layer and the mandrel, and a doped region is formed between the source and drain regions, in accordance with the present invention.

In various embodiments, a first conducting layer 58 is deposited over the dielectric layer 12 and over the mandrel 56. The first conducting layer 58 can be a metal layer. The metal layer 58 can be, e.g., a titanium nitride (TiN) layer. In one example, the metal layer 58 can have a thickness of about 10 nm.

Figure 15:
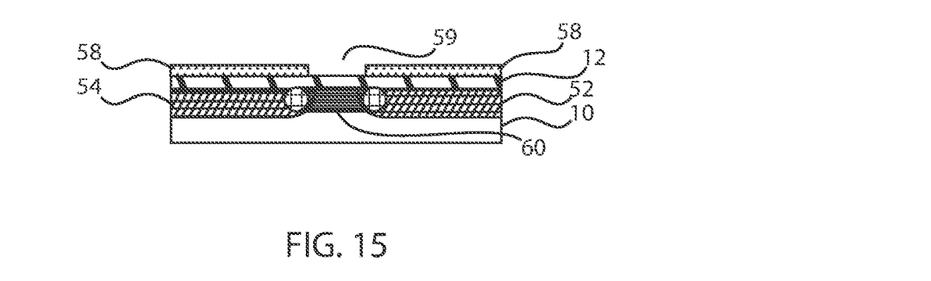
FIG. 15 is a cross-sectional view of FIG. 14 where the mandrel is removed, in accordance with the present invention.

FIG. 15 is a cross-sectional view of FIG. 14 where the mandrel is removed, in accordance with the present invention.

In various embodiments, the mandrel 56 is removed to expose a top surface 59 of the dielectric layer 12. Thus, this results in the first conducting layer 58 being formed over the source and drain regions 52, 54. The mandrel 56 can be removed by, e.g., a wet etch process. Additionally, a doped region 60 is formed between the source and drain regions 52, 54. The doped region 60 can be formed between the semiconductor substrate 10 and the dielectric layer 12. The doped region 60 can be, e.g., doped with an n-type element.

Figure 16:
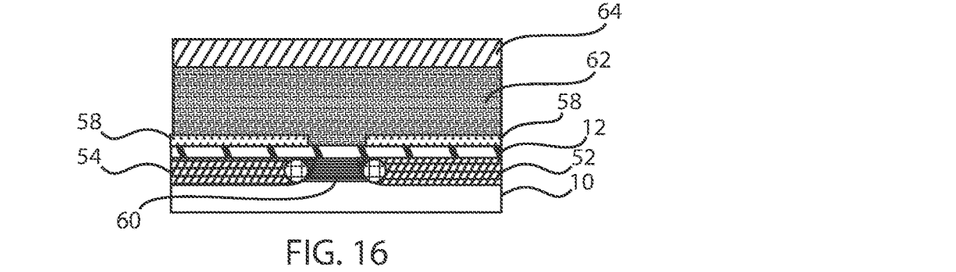
FIG. 16 is a cross-sectional view of FIG. 15 where a ferroelectric layer and a second conducting layer are formed over the first conducting layer, in accordance with the present invention.

FIG. 16 is a cross-sectional view of FIG. 15 where a ferroelectric layer and a second conducting layer are formed over the first conducting layer, in accordance with the present invention.

In various embodiments, a ferroelectric layer 62 is deposited, followed by the deposition of a second conducting layer 64. The ferroelectric layer 62 can be, e.g., a hafnium oxide layer. The second conducting layer 62 can be a metal layer. The metal layer 62 can be, e.g., a TiN layer. The thickness of the metal layer 62 can be, e.g., 20 nm.

Figure 17:
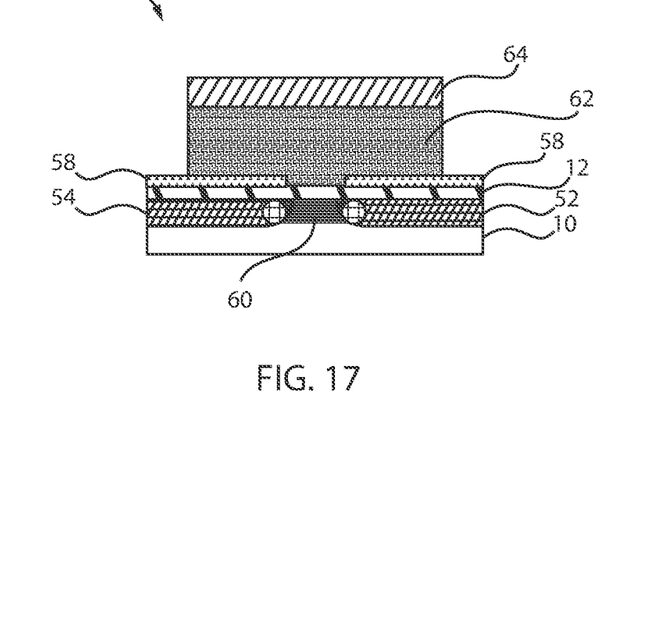
FIG. 17 is a cross-sectional view of FIG. 16 where the first conducting layer, the ferroelectric layer, and the second conducting layer are patterned and portions etched away, in accordance with the present invention.

FIG. 17 is a cross-sectional view of FIG. 16 where the first conducting layer, the ferroelectric layer, and the second conducting layer are patterned and portions etched away, in accordance with the present invention.

In various embodiments, the first conducting layer 58, the ferroelectric layer 62, and the second conducting layer 64 are patterned and portions etched away to form resulting structure 50'.

Figure 18:
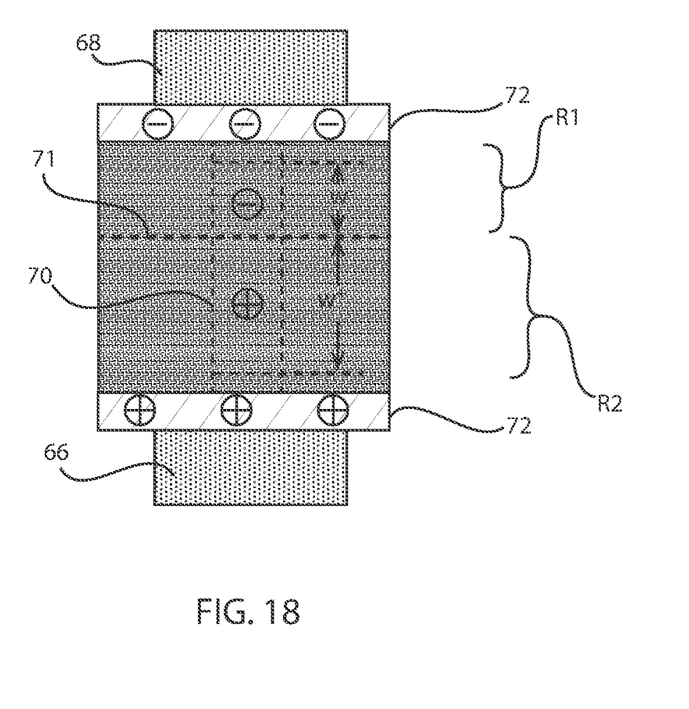
FIG. 18 is a plan view of FIG. 17, with the second conducting layer removed, where pinning layers are shown, as well as a slot defined in the bottom metal electrode for allowing modulation of a field effect transistor (FET) channel, in accordance with the present invention.

FIG. 18 is a plan view of FIG. 17, with the second conducting layer removed, where pinning layers are shown, as well as a slot defined in the bottom metal electrode for allowing modulation of a field effect transistor (FET) channel, in accordance with the present invention.

In various embodiments, the structure 50' of FIG. 17 is an MFM capacitor with pinning layers 72 and a slot 70 in the bottom electrode 58 allowing modulation of the FET channel underneath. The single domain wall or boundary 71, which can move reversibly in response to +/− gate voltages, demarcates the FET into regions (R1 and R2) of enhanced and reduced conductivity along the length direction. An n-doped channel is needed for an n-type FET in order that the channel does not become completely depleted under opposing polarization condition. This can either be accomplished using selective doping self-aligned to the slot 70 or using a uniformly doped semiconductor layer with bias applied to the bottom electrode to deplete this layer outside the slot 70. The orthogonal direction of the channel, compared to the first embodiment (FIGS. 1-7), allows a much narrower slot to be used resulting in less disturbance to the FE layer.

In summary, applications exist where charge stored on a capacitor or ferroelectric (FE) polarization of the capacitor dielectric us used as a memory element. The charge state, or polarization, of the capacitor can be read out by an indirect read mechanism, where a small part of the capacitor's polarization is coupled to the semiconductor channel via, e.g., a dielectric sidewall. Due to the small amount of charge coupled, the resistance of the FET will be much higher than in the case of direct modulation. Indirect modulation can be achieved by either one of two structures, that is, a metal-insulator-metal (MIM) structure or a metal-ferroelectric-metal (MFM) structure. By applying a sidewall dielectric to either the MIM structure or the MFM structure, the electric field is essentially coupled indirectly to an adjacent FET channel in the semiconductor. In an alternative embodiment, the a small part of the electric field can be diverted by a slot formed in the bottom metal electrode of the MIM structure or the MFM structure. The MIM structure or the MFM structure can be placed on a semiconductor substrate separated by a second insulator. Control of the voltage of the bottom electrode, or workfunction of the bottom electrode, can be used to control the conductivity of the semiconductor under this electrode. Doped source and drain regions can be placed along or across the sidewall dielectric or slot to complete the readout FET. The FET channel can be doped (p-type or n-type) to tune its conductivity to a desired range. Stated differently, a field shield suppresses direct modulation of the semiconductor, yet insulated from the semiconductor material, while including, e.g., a slot or a sidewall dielectric (spacer) to divert a portion of the electric field to the semiconductor region including the source and drain regions. The slot or dielectric sidewall can be referred to as sneak paths.

It is to be understood that the present invention will be described in terms of a given illustrative architecture; however, other architectures, structures, substrate materials and process features and steps and/or blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for coupling a capacitor's polarization to a semiconductor channel via a dielectric sidewall (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A metal-insulator-metal (MIM) capacitor structure comprising:
   a dielectric layer formed over a first conducting layer;
   a second conducting layer formed over the dielectric layer; and
   a sidewall dielectric formed adjacent the first conducting layer;
   wherein an electric field is created indirectly through the sidewall dielectric to an adjacent field effect transistor (FET) channel.

2. The structure of claim 1, wherein source and drain regions are formed within a semiconductor substrate.

3. The structure of claim 2, wherein the first conducting layer is formed over the source and drain regions.

4. The structure of claim 3, wherein the sidewall dielectric is further formed adjacent the dielectric layer.

5. The structure of claim 4, wherein pinning layers are formed on opposed ends of the dielectric layer.

6. The structure of claim 5, wherein the pinning layers have opposite polarization relative to each other resulting in the dielectric layer separated into two regions by a domain boundary, the two regions having opposite polarization relative to each other.

7. The structure of claim 6, wherein the domain boundary shifts based on a voltage applied to the MIM capacitor structure.

8. The structure of claim 7, wherein the sidewall dielectric is traverse to the FET to divide the FET channel longitudinally into two regions of varying lengths and different resistivities.

9. The structure of claim 7, wherein the sidewall dielectric extends along the FET channel to divide a width of the FET channel into two regions.

10. The structure of claim 1, wherein the sidewall dielectric defines a high permittivity spacer.

11. The structure of claim 1, wherein the first conducting layer is a titanium nitride (TiN) layer and the dielectric layer is a ferroelectric layer.

12. The structure of claim 1, wherein the sidewall dielectric is hafnium oxide.

13. The structure of claim 1, wherein a doped region is formed under and in direct contact with the sidewall dielectric.

14. A metal-insulator-metal (MIM) capacitor structure comprising:
   a sidewall dielectric disposed adjacent a first conducting layer and a dielectric layer;
   wherein an electric field is created indirectly through the sidewall dielectric to an adjacent field effect transistor (FET) channel.

15. The structure of claim 14, wherein:
   the dielectric layer is disposed over the first conducting layer; and
   a second conducting layer is disposed over the dielectric layer.

16. The structure of claim 15, wherein source and drain regions are disposed within the semiconductor substrate.

17. The structure of claim 16, wherein the first conducting layer is disposed over the source and drain regions.

18. The structure of claim 14, wherein pinning layers are formed on opposed ends of the dielectric layer.

19. The structure of claim 18, wherein the pinning layers have opposite polarization relative to each other resulting in the dielectric layer separated into two regions by a domain boundary, the two regions having opposite polarization relative to each other.

20. The structure of claim 19, wherein
   the domain boundary shifts based on a voltage applied to the MIM capacitor structure; and
   wherein the sidewall dielectric is traverse to the FET to divide the FET channel longitudinally into two regions of varying lengths and different resistivities.

* * * * *